United States Patent [19]

Cordelle et al.

[11] Patent Number: 5,250,782
[45] Date of Patent: Oct. 5, 1993

[54] METHOD FOR THE CLOSING, BY LASER, OF ELECTRONIC CIRCUIT PACKAGES, NOTABLY HYBRID CIRCUIT PACKAGES, MINIMIZING MECHANICAL STRESSES

[75] Inventors: Christian Cordelle, Les Ulis; Florence de Reynal, Saint Mande; Dominique Goujard, Chilly Mazarin; Michel Sergent, Paris, all of France

[73] Assignee: Thomson-CSF, Puteaux, France

[21] Appl. No.: 931,052

[22] Filed: Aug. 17, 1992

[30] Foreign Application Priority Data

Sep. 3, 1991 [FR] France ................. 91 10863

[51] Int. Cl.$^5$ .......................................... B23K 26/00
[52] U.S. Cl. ....................... 219/121.64; 219/85.13
[58] Field of Search ................ 219/121.63, 121.64, 219/85.12, 85.13

[56] References Cited

U.S. PATENT DOCUMENTS

| | | | |
|---|---|---|---|
| 4,521,668 | 6/1985 | Osial et al. | 219/121.63 |
| 4,760,240 | 7/1988 | Iikawa et al. | 219/121.64 |
| 4,960,973 | 10/1990 | Fouche et al. | 219/121.64 |

FOREIGN PATENT DOCUMENTS 0362045 4/1990 European Pat. Off. .

OTHER PUBLICATIONS

"A New Laser Hermetic Sealing Technique for Aluminum Package," Takeaki Sakai, IEEE Transactions on Components, Hybrids, and Manufacturing, No. 3, Sep. 87, New York, USA, pp. 433–436.

"Laser-welding the Large Mic—A New Approach to Hermetic Sealing", Gordon Simpson, Microwave Journal, vol. 27, No. 11, Nov. 1984, pp. 169–179.

Primary Examiner—C. L. Albritton
Attorney, Agent, or Firm—Meltzer, Lippe, Goldstein et al.

[57] ABSTRACT

A method for the closing, by laser, of packages of electronic circuits, notably hybrid circuit packages, said method minimizing mechanical stresses. The soldering is done along a soldering path on the lid of the package. The soldering path is divided into segments and two consecutive segments are never soldered one after the other. The method can be applied to the closing of large-sized hybrid packages.

3 Claims, 1 Drawing Sheet

METHOD FOR THE CLOSING, BY LASER, OF ELECTRONIC CIRCUIT PACKAGES, NOTABLY HYBRID CIRCUIT PACKAGES, MINIMIZING MECHANICAL STRESSES

BACKGROUND OF THE INVENTION

The present invention relates to a method for the closing, by laser, of packages of electronic circuits, notably hybrid circuit packages, said method minimizing mechanical stresses. It can be applied, more particularly, to the closing, by laser, of large-sized hybrid circuit packages, called macro-hybrid packages, where a metal lid is closed on a frame which is itself soldered to a ceramic substrate bearing screen-printed tracks and electronic components.

More generally, the invention can be applied to any hybrid circuit packages for which it is necessary to minimize the mechanical stresses related to closing by laser. These would be, for example, large-sized, all-metal solid packages.

The method of closing a metal package by laser is known to those skilled in the art. This method provides for tightly sealed soldering through the melting of the metal constituting the lid of the package. The parameters of the laser are determined as a function of the nature of the metals and the thickness of the lid. In the case of macro-hybrid packages for example, the substrate of which is constituted by a ceramic wafer supporting the hybrid electronic circuits, the frame is soldered to this ceramic substrate and not to a metal substrate. Experience has shown that any stress contributed by a solder made by means of a laser may prompt a fault at the solder joint between the frame and the ceramic. These stresses are actually related to the heating of the metals that get soldered to each other. The deformation thus created in the unit makes it impossible to obtain tight sealing in accordance with prevailing standards. Known methods consist, for example, in the soldering, transparently, of a lid made of an iron-nickel alloy to a frame made of an iron-nickel alloy or an iron cobalt-nickel alloy for example so that the laser beam, starting from a point of the perimeter of the macro-hybrid, travels along this perimeter and returns to the starting point. However, methods of this type lead to the above-mentioned deformations, prompted by the mechanical stresses exerted by the laser soldering. Indeed, before closing, the ceramic substrate of a macro-hybrid supporting the soldered frame generally displays a convexity of the order of 100 to 200 μm due to the soldering with the frame whereas the macro-hybrid package, which has a surface area of the order of one dm$^2$ once it is closed, displays a concavity of the order of 100 to 200 μm corresponding to the stresses applied to the frame by the laser soldering. This results in defects of impervious sealing between the frame and the ceramic substrate, preventing any encapsulation in accordance with certain standards as laid down. Furthermore, when the laser soldering is done in the form of a continuous soldering, as described here above, the imperviousness between the lid and the frame is not acquired in a single pass: it is then necessary to double and even triple the seam of solder in the unsealed zones. This contributes greatly to increasing the stresses exerted by the soldering and increases manufacturing costs.

SUMMARY OF THE INVENTION

The aim of the invention is to overcome the above-mentioned drawbacks.

To this effect, an object of the invention is a method for the closing, by laser, of packages of electronic circuits, notably hybrid circuit packages, said method minimizing mechanical stresses, the package being constituted by a substrate, a frame and a lid, the soldering of the lid to the frame being done by the moving of the laser beam along a given path on the lid of the package, the path being closed, wherein the soldering path is divided into segments and wherein two consecutive segments are never soldered one after the other.

The main advantages of the invention are that it enables the reduction of the stresses exerted by laser soldering, can be used to obtain tightly sealed packages without any need for resoldering, and gives greater reliability and improved output.

BRIEF DESCRIPTION OF THE DRAWING

Other features and advantages of the invention shall appear from the following description made with reference to the appended drawing, wherein.

DESCRIPTION OF THE INVENTION

Figure 1A:
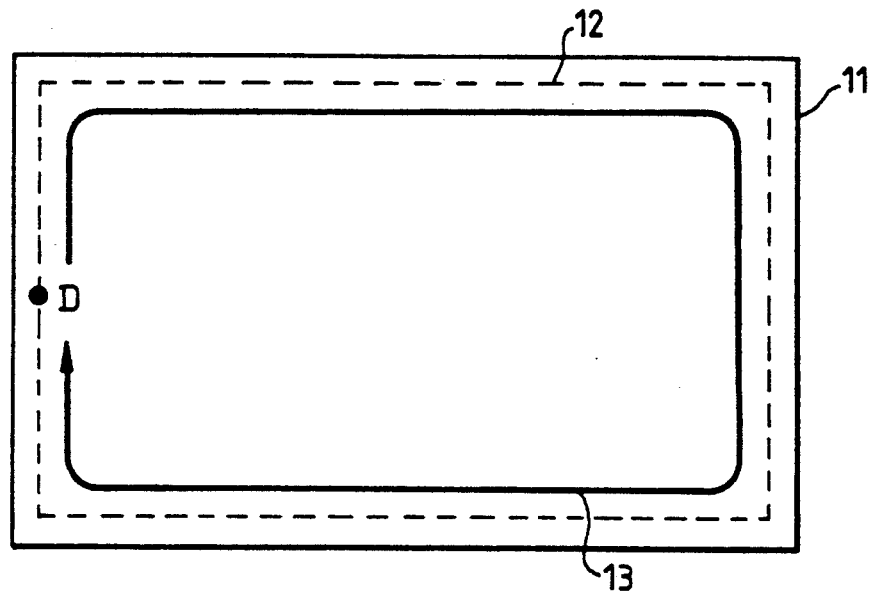
FIG. 1a illustrates a method of laser soldering in a single segment.
Figure 1B:
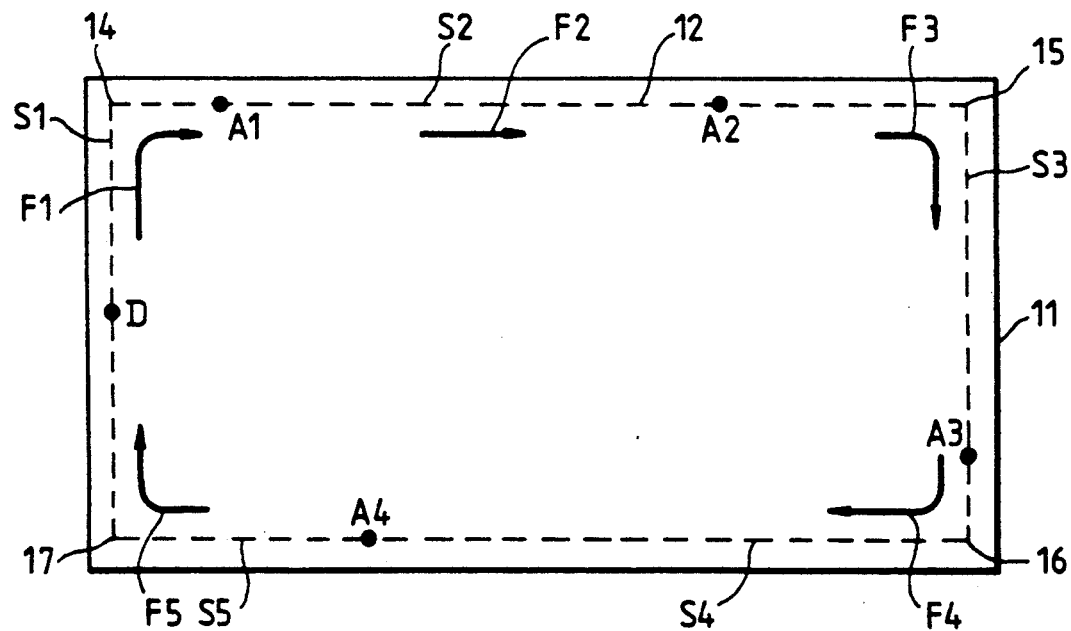
FIG. 1b illustrates the method according to the invention.

FIG. 1a shows a top view of a rectangular lid 11 to be soldered to a package frame. The line of dashes 12 represents the soldering path. This figure illustrates a solder made continuously in a single segment as suggested by the arrow 13. In this case, the laser beam starts from the point D, travels along the path 12 in the direction of the arrow 13 and then returns to this same point D. As explained here above, this method creates stresses that are detrimental to the impervious sealing of the package. To limit these stresses, or even eliminate them, the method according to the invention divides the solder path 12 into segments, wherein two consecutive segments are never soldered to each other as shown in FIG. 1b.

In this figure, the lid 11 is still shown in a top view as is the solder path 12, but this path is divided into five segments S1, S2, S3, S4 and S5, respectively limited by the points D and A1, A1 and A2, A2 and A3, A3 and A4 and A4 and D. The path 12 is herein divided into five segments by way of an example. It is clearly possible, according to the invention, to divide the contour to be soldered into as many segments as are needed or as are feasible. According to the invention, the laser firing starts at the point D, then the beam of the laser travels through the segment S1 up to the point A1 along the direction indicated by the arrow F1. Once the segment S1 has been crossed, the laser beam travels through the segment S3 from the point A2 up to the point A3 in the direction of the arrow F3. Once the segment S3 has been crossed, the laser beam travels through the segment S5 from the point A4 up to the point D in the direction of the arrow F5. Once the segment S5 has been crossed, the laser beam travels through the segment S2 from the point A1 up to the point A2 in the direction of the arrow F2. Finally, once the segment S2 has been crossed, the beam travels through the segment S4 from the point A3 up to the point A4. Once this segment S4 has been crossed by the laser beam, the entire soldering path 12 has been travelled through, and the closing of the package by laser is completed. This method according to the invention, in which the solder path 12 is segmented into several sections and where two consecutive segments are never soldered one after the other, makes it possible to limit the mechanical stresses induced by the heating of the materials during the soldering, following by their shrinking. It is therefore necessary to plan for the necessary number of segments compatible with a deformation of the package limiting the non-imperviousness to a level lower than or equal to the standard laid down. Furthermore, the quality of impervious sealing obtained on each segment at the very first soldering pass avoids the need for additional soldering operations. At the level of the points D, A1, A2, A3 and A4, which are points of intersection of two consecutive segments, it is preferable to provide for a slight overlapping of the laser beam passes in order ensure soldering all along the path 12. Finally to provide for perfectly impervious sealing at the corners 14, 15, 16 and 17 of the soldering path 12, these corners should be included in segments and should not constitute boundaries of segments.

The method according to the invention was been tried and tested on macro-hybrid packages with a length equal to 140 mm and a width equal to 70 mm. The camber of the package obtained after closing remained very small since the convexity measured was in the region of only 50 $\mu$m, thus providing for excellent sealing quality between the substrate of the package and its frame. The method according to the invention can be applied to any type of material constituting the lid and the frame of the package within the limits compatible with the laser application.

What is claimed is:

1. A method for the closing, by laser, of packages of electronic circuits, notably hybrid circuit packages, said method minimizing mechanical stresses, the package being constituted by a substrate, a frame and a lid, the soldering of the lid to the frame being done by the moving of the laser beam along a given path on the lid of the package, the path being closed, wherein the soldering path is divided into segments and wherein two consecutive segments are never soldered one after the other.

2. A method according to claim 1, wherein the corners of the soldering path are each included in a segment and do not constitute boundaries of segments.

3. A method according to claim 1 wherein, at the boundaries of the segments, the solderings substantially overlap each other.

* * * * *